(12) United States Patent
Khan et al.

(10) Patent No.: US 6,706,635 B2
(45) Date of Patent: Mar. 16, 2004

(54) INNOVATIVE METHOD TO BUILD A HIGH PRECISION ANALOG CAPACITOR WITH LOW VOLTAGE COEFFICIENT AND HYSTERESIS

(75) Inventors: Imran M. Khan, Richardson, TX (US); William E. Nehrer, Soquel, CA (US); James Todd, Plano, TX (US); Weidong Tian, Dallas, TX (US); Louis N. Hutter, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 10/163,450

(22) Filed: Jun. 5, 2002

(65) Prior Publication Data

US 2003/0228764 A1 Dec. 11, 2003

(51) Int. Cl.[7] .............................................. H01L 21/302
(52) U.S. Cl. ...................... 438/692; 438/694; 438/699; 438/702; 438/706
(58) Field of Search ................................. 438/692, 699, 438/702, 706, 694

(56) References Cited

U.S. PATENT DOCUMENTS

| | | |
|---|---|---|
| 4,971,924 A | 11/1990 | Tigelaar et al. |
| 5,554,558 A | 9/1996 | Hsu et al. |
| 5,571,746 A | 11/1996 | Pan |
| 5,670,410 A | 9/1997 | Pan |
| 5,753,549 A | 5/1998 | Lee |
| 5,804,488 A | 9/1998 | Shih et al. |
| 5,851,871 A | 12/1998 | Re |
| 6,030,866 A | 2/2000 | Choi |
| 6,215,142 B1 | 4/2001 | Lee et al. |
| 6,218,234 B1 | 4/2001 | Yu et al. |
| 6,251,724 B1 | 6/2001 | Ku et al. |
| 6,281,541 B1 | 8/2001 | Hu |
| 6,291,307 B1 | 9/2001 | Chu et al. |
| 6,313,031 B1 * | 11/2001 | Schuele et al. .............. 438/643 |
| 6,319,789 B1 | 11/2001 | Carstensen |
| 6,376,299 B1 | 4/2002 | Joo et al. |
| 6,385,020 B1 | 5/2002 | Shin et al. |
| 6,455,370 B1 * | 9/2002 | Lane ........................... 438/253 |
| 6,469,336 B2 * | 10/2002 | Deboer et al. ............... 257/301 |
| 6,495,920 B2 * | 12/2002 | Lee ............................. 257/768 |
| 6,529,397 B2 * | 3/2003 | Takeda et al. ................. 365/63 |
| 6,613,670 B2 * | 9/2003 | Rha et al. .................... 438/657 |
| 2002/0053690 A1 | 5/2002 | Kim et al. |

* cited by examiner

*Primary Examiner*—Nadine G. Norton
*Assistant Examiner*—Binh X. Tran
(74) *Attorney, Agent, or Firm*—Yingsheng Tung; Wade James Brady, III; Frederick J. Telecky, Jr.

(57) ABSTRACT

The present invention relates to a method for forming an anlog capacitor on a semiconductor substrate. The method comprises forming a field oxide over a portion of the substrate, and forming a polysilicon layer over the field oxide layer, and subsequently forming a silicide over the polysilicon layer. A first interlayer dielectric layer is formed over the substrate, and a capacitor masking pattern is formed. The first interlayer dielectric is etched using the capacitor masking pattern as a mask and the silicide layer as an etch stop, and a thin dielectric is formed over the substrate. A contact masking pattern is formed over the substrate, and a subsequent etch is performed on the thin dielectric and the first interlayer dielectric using the silicide and substrate as an etch stop. A metal layer is deposited over the substrate, and is subsequently planarized, thereby defining an analog capacitor.

33 Claims, 10 Drawing Sheets

INNOVATIVE METHOD TO BUILD A HIGH PRECISION ANALOG CAPACITOR WITH LOW VOLTAGE COEFFICIENT AND HYSTERESIS

TECHNICAL FIELD OF INVENTION

The present invention relates generally to integrated circuits, and more particularly, to a method of forming a high precision analog capacitor for use in an integrated circuit.

BACKGROUND OF THE INVENTION

The manufacturing of semiconductor devices is a combination of the creation of a variety of components that collectively perform functions of data manipulation (logic functions) and of data retention (storage functions). The vast majority of these functions operate in a digital or on/off mode, and as such, recognizes "zero" and "one" conditions within the operational levels of the circuits. There are, in addition, applications that make use of analog levels of voltage, for example, wherein the voltage may have a spectrum of values between a high limit and a low limit. Furthermore, applications exist where both digital and analog methods of signal processing reside in the same semiconductor device.

A mixture of functions and processing capabilities brings with it a mixture of components that can co-exist within one semiconductor device. Where the vast majority of device components is made up of transistors and a variety of switching components that address logic processing functions, it is not uncommon to also see resistors and capacitors that form part of a semiconductor device. For instance, it is known that capacitors form a basic component of many analog circuits that are used for analog applications such as analog-to-digital and digital-to-analog data conversion. Besides A/D conversion, capacitors perform a variety of critical tasks required to interface digital data with the external world, such as amplification, pre-filtering demodulation and signal conditioning. It is also well known in the art that capacitors are widely applied in digital applications such as the storage node for Dynamic Random Access Memory (DRAM) circuits. In general, an analog capacitor stores information in various states, whereas a digital capacitor stores information in two states, namely, low and high. Typical analog applications involve analog-to-digital or digital-to-analog data conversion. Beside data conversion In reference to the manufacture of analog capacitors, FIG. 1A illustrates a cross-sectional view 100 of a conventional analog capacitor 105, and FIG. 1B illustrates a conventional method 150 of fabrication of said capacitor. One of the first processing steps that is required in forming the capacitor 105 on the surface of a semiconductor substrate 110 is to electrically isolate the active regions (the regions where transistor devices will be created) on the surface of the substrate. Act 160 of FIG. 1B isolates the device 105 from other devices (not shown) on the semiconductor substrate 110 by forming a field oxide ($F_{OX}$) 115. One conventional approach in the semiconductor industry for forming the $F_{OX}$ 115 is by the Local Oxidation of Silicon (LOCOS) method. LOCOS typically uses a patterned silicon nitride ($Si_3N_4$) layer (not shown) as an oxidation barrier mask, wherein the underlying silicon substrate 110 is selectively oxidized. One disadvantage of utilizing LOCOS is that a non-planar surface of the semiconductor substrate results. Another method of forming the field oxide ($F_{OX}$) is to utilize Shallow Trench Isolation (STI) (not shown). One method of utilizing STI is to first etch trenches (not shown) having essentially vertical sidewalls in the silicon substrate. The trenches are typically then filled with a Chemical Vapor Deposition (CVD) of silicon oxide ($SiO_2$) and the silicon oxide is then plasma etched or planarized using CMP to form an STI region which is significantly planar.

Following the formation of the $F_{OX}$ 115, a polysilicon layer 120 is formed over the $F_{OX}$ 115 in act 162 of FIG. 1B to define a bottom plate 121 of a capacitor 105. A silicide layer 125 is subsequently formed over the polysilicon layer 120 in act 164 to form a conductive etch stop over the polysilicon layer. The formation of the polysilicon layer 120 typically forms a vertical step 127 on the surface of the substrate 110. Unfortunately, this vertical step 127 results in deleterious effects when forming the capacitor 105 in the prior art, as will be described hereafter.

Subsequent to forming the polysilicon layer 120 and silicide layer 125, an oxide layer 130 is blanket deposited over the substrate in act 166 of FIG. 1B, typically by Low Pressure Chemical Vapor Deposition (LPCVD) to form a dielectric layer for the capacitor 105. A titanium nitride (TiN) layer 135 is then deposited over the substrate 110 in act 168 of FIG. 1B. A titanium nitride (TiN) hard mask layer 137 which is selective with respect to the underlying TiN layer 135 is furthermore formed over the TiN layer 135 in act 170. A capacitor masking pattern (not shown) is formed in act 172, whereby a subsequent hard mask etch and TiN etch are performed in act 174, thereby removing portions of the TiN hard mask layer 137 and TiN layer 135 to define a top plate 140 of the capacitor 105.

Following the TiN etch of act 174, an Interlayer Dielectric (ILD) layer 142 is formed by conventional methods. A contact masking pattern (not shown) is formed over the ILD layer 142 in act 178 of the prior art, and the ILD layer is etched in act 180 to form contact holes 143. A metal 144 is deposited over the ILD layer 142 in act 182, thereby filling the contact holes 143, and the metal is subsequently planarized in act 184. A wiring layer 145 in then formed over the contact holes 143 to interconnect the capacitor 105 to other devices (not shown) on the semiconductor substrate 110.

Due to the prior art method 150 utilizing a TiN layer 135 for a top plate 140 of the capacitor 105, the TiN etching performed in act 174 is critical, since the etch must stop at the semiconductor substrate 110 in order to avoid pitting of the semiconductor substrate. The etch must also be sufficient enough, however, to remove the TiN layer 135 residing over the silicide layer 125 in order to avoid stringers, (i.e., un-etched TiN residing on the suicide layer), which could potentially cause leakage in operation of the capacitor 105. Accordingly, the TiN etch process of act 174 must be monitored closely in order to avoid the deleterious effects of both over-etching into the semiconductor substrate 110 as well as under-etching the TiN layer 135. Furthermore, the step 127 of FIG. 1A caused by the formation of the polysilicon layer 120 over a non-planar surface of the substrate 110 accentuates the difficulty of the TiN etch when LOCOS is utilized in forming the $F_{OX}$.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention relates generally to a method of forming an analog capacitor on a semiconductor substrate. More particularly, the invention relates to a method of forming a high precision analog capacitor over a field oxide ($F_{OX}$) on a semiconductor substrate. According to the present invention, a field oxide layer is formed over a portion of the substrate. A polysilicon layer is formed over the field oxide layer, thereby defining a bottom plate of the capacitor, and a silicide is formed over the polysilicon layer, thereby defining a bottom plate of the capacitor. A first interlayer dielectric (ILD) layer is then formed over the substrate. According to one exemplary aspect of the invention, the first ILD layer comprises a plurality of layers.

Following the formation of the first ILD layer, a capacitor masking pattern is formed over the substrate, and an etching process is performed, wherein the first interlayer dielectric is etched using the capacitor masking pattern as a mask and the silicide as an etch stop, thereby defining a capacitor region. A thin dielectric is then formed over the substrate. According to another exemplary aspect of the present invention, the thin dielectric is formed by a low pressure chemical vapor deposition (LPCVD) process.

A contact masking pattern having one or more contact holes is formed over the substrate following the formation of the thin dielectric, and another etch process is performed, wherein the thin dielectric and the first interlayer dielectric are etched using the contact masking pattern as a mask and the silicide as an etch stop. According to yet another exemplary aspect of the invention, the contact masking pattern comprises a bottom plate capacitor contact hole and a moat contact hole, wherein the etching the thin dielectric and the first ILD layer comprises using the silicide as an etch stop for the bottom plate capacitor contact hole and the semiconductor substrate as an etch stop for the moat contact hole.

A metal layer is subsequently formed over the substrate, wherein the metal layer substantially fills the one or more contact holes. Furthermore, the metal layer is planarized, wherein a top plate of the capacitor and an electrical connection to the bottom plate of the capacitor are defined, and wherein the top plate of the capacitor and the electrical connection to the bottom plate of the capacitor are laterally isolated by the first ILD.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
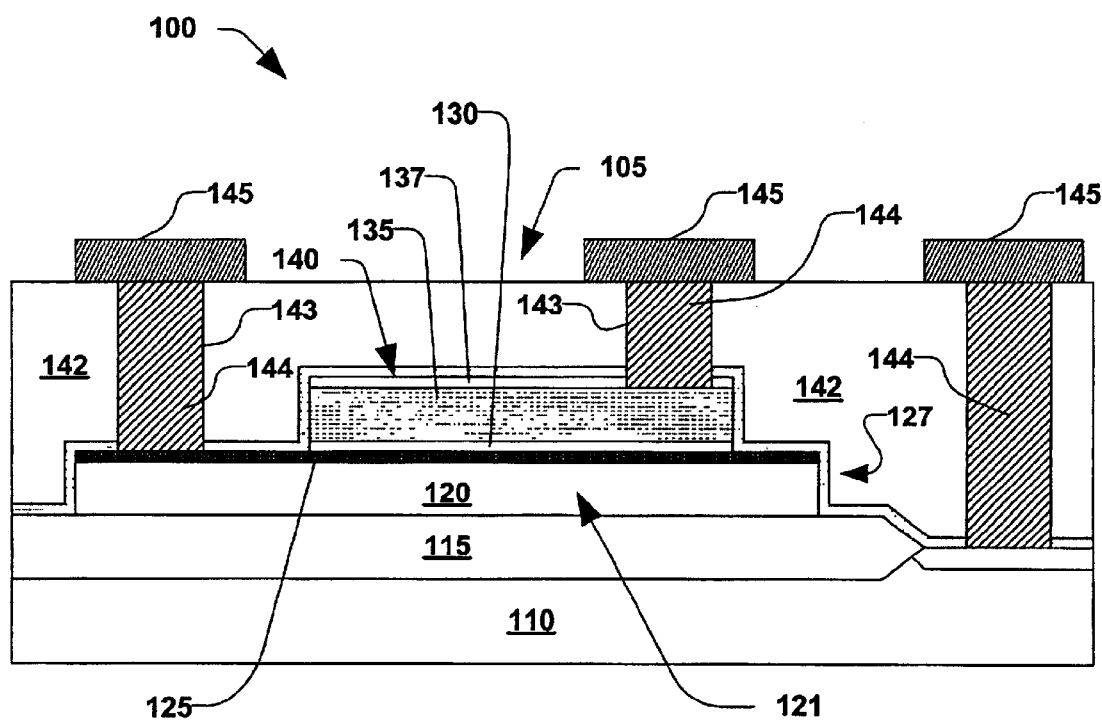
FIG. 1A illustrates a partial cross-sectional view of a conventional analog capacitor formed according to a method of the prior art.
Figure 1B:
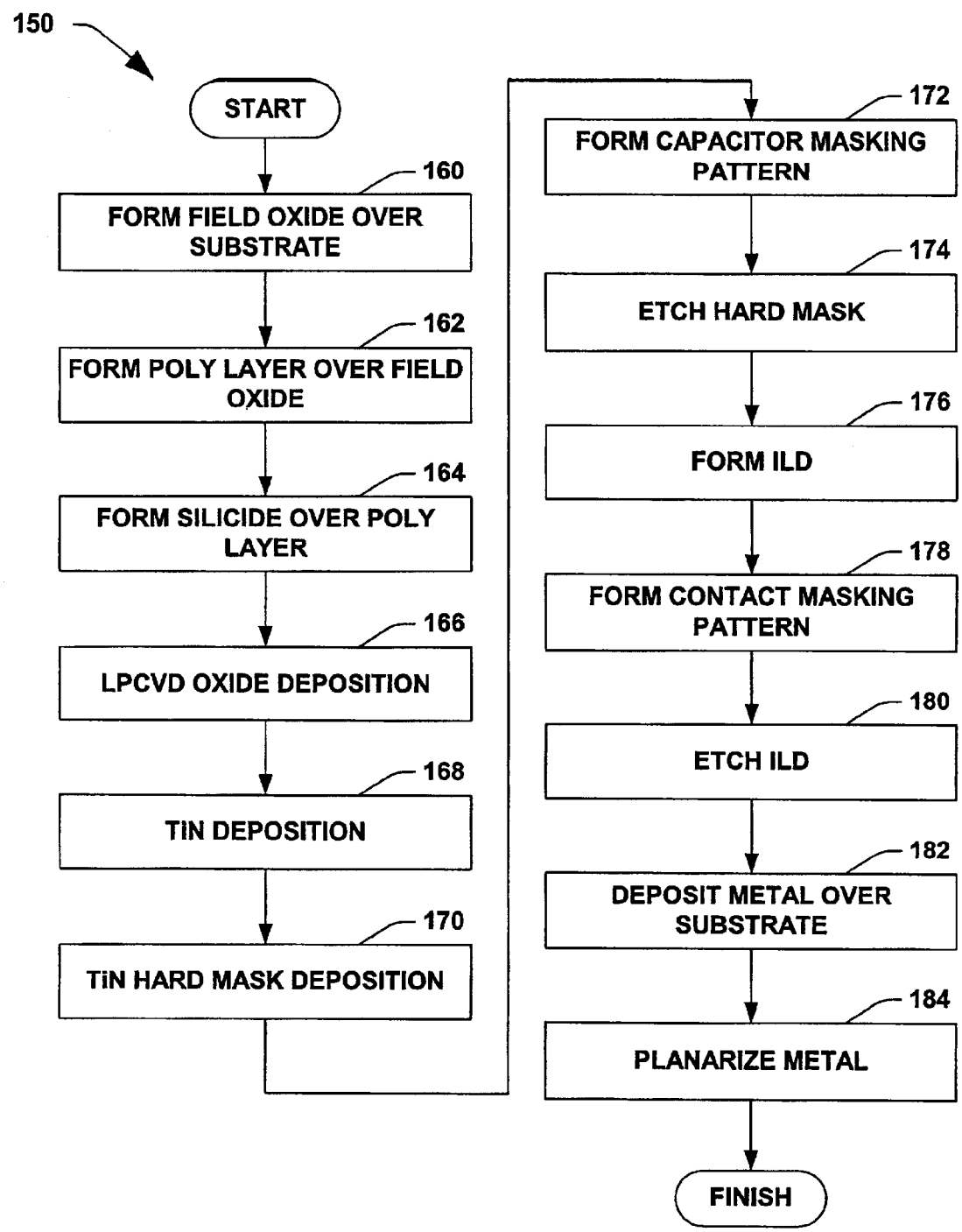
FIG. 1B illustrates a method for forming a conventional analog capacitor according to the prior art.

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on, for example, silicon-germanium, germanium, or gallium arsenide.

The present invention is directed toward a method for forming an analog capacitor over a semiconductor substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the apparatus and systems illustrated and described herein as well as in association with other systems not illustrated.

Figure 2A:
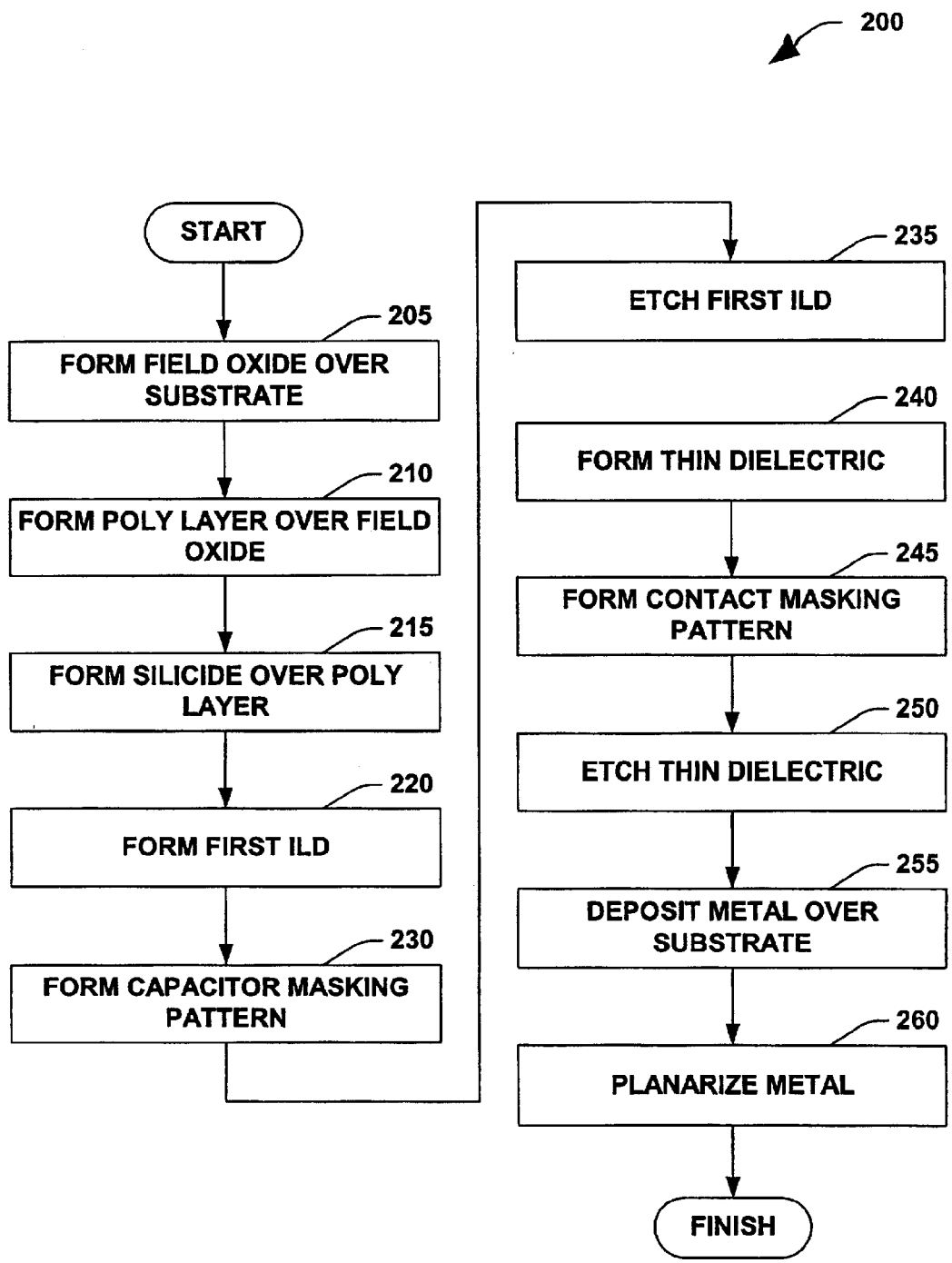
FIG. 2A illustrates a method for forming an analog capacitor according to the present invention.
Figure 3:
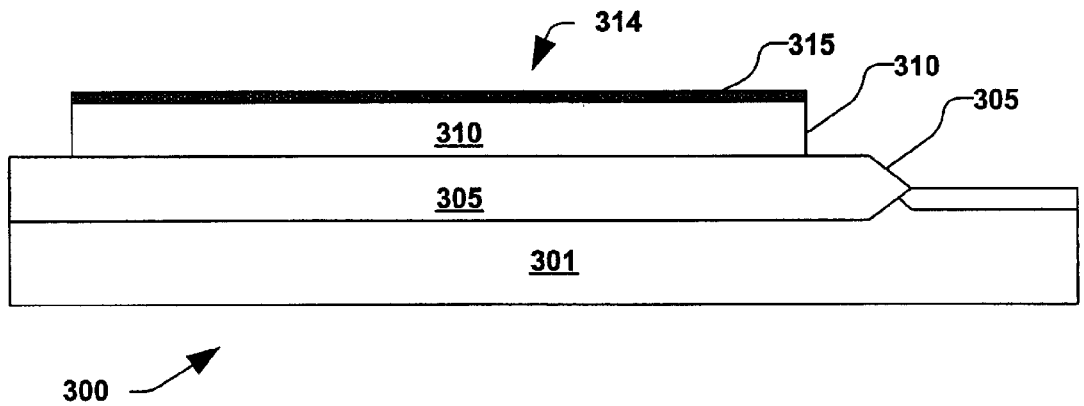
FIG. 3 illustrates a partial cross-sectional view of a step of forming a field oxide and polysilicon layer for an analog capacitor according to the present invention.

Referring now to FIG. 2A, a method 200 of forming an analog capacitor on a semiconductor substrate according to one aspect of the present invention will be described. The method 200 begins with act 205, wherein a field oxide ($F_{OX}$) is formed over the semiconductor substrate, thereby defining active regions (e.g., the regions where semiconductor devices will be created). The active regions are furthermore electrically isolated on the substrate surface by the field oxide. A cross-sectional view 300 of an exemplary semiconductor substrate 301 is illustrated in FIG. 3, wherein a field oxide 305 is formed over the semiconductor substrate by a Local Oxidation of Silicon (LOCOS) method. Alternatively, a Shallow Trench Isolation (STI) method may be utilized to form the field oxide 305, however, any method of forming an isolated field oxide over the semiconductor substrate 301 is contemplated as falling within the scope of the present invention.

Following the formation of the field oxide 305, a polysilicon layer 310 is formed over the field oxide in act 210 of FIG. 2A. As illustrated in FIG. 3, the polysilicon layer 310, for example, can be blanket deposited over the substrate 301 and patterned by conventional lithography and etching techniques. The polysilicon layer 310 which remains after etching thereby defines a bottom plate 314 of a capacitor. After the polysilicon layer 310 is formed over the field oxide 305 in act 210, a silicide layer 315 is formed over the polysilicon layer in act 215 of FIG. 2A. As will be understood by one of ordinary skill in the art, the silicide layer 315 of FIG. 3 may be formed by a metal deposition and thermal treatment of the substrate 301.

Figure 4:
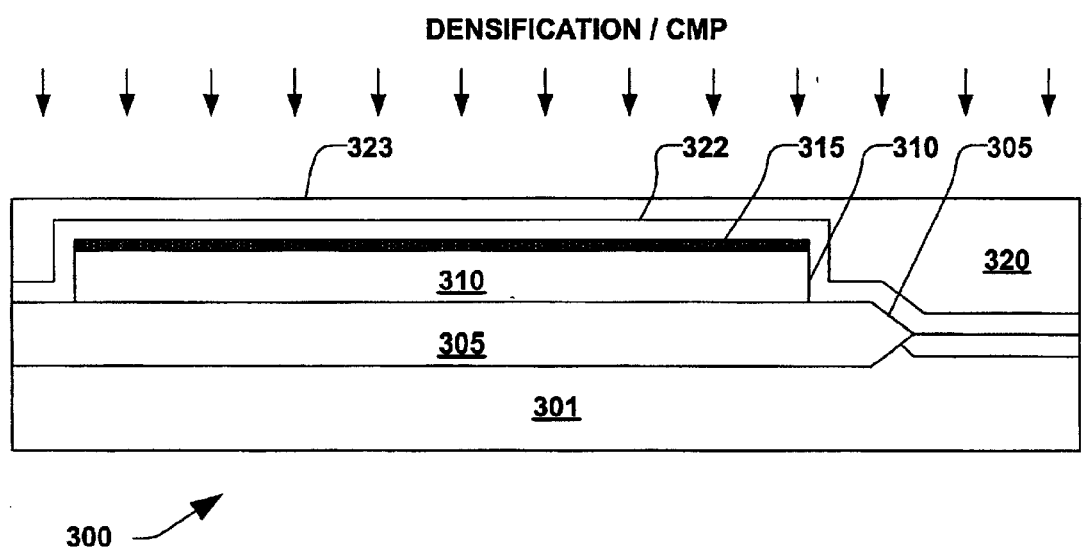
FIG. 4 illustrates a partial cross-sectional view of a step of forming a first interlayer dielectric layer for an analog capacitor according to the present invention.

FIG. 4 illustrates a first Interlayer Dielectric (ILD) layer 320 (e.g., an oxide layer) which is formed over the semiconductor substrate 301 in act 220 of FIG. 2A. According to one exemplary aspect of the present invention, the ILD layer 320 comprises a plurality of layers. For example, the ILD layer 320 can comprise one or more of borophosphosilicate glass (BPSG), phosphosilicate glass (PSG), undoped silicate glass (USG), borosilicate glass (BSG), tetraethylorthosilicate (TEOS), undoped silicon dioxide, or the like. According to one exemplary aspect of the present invention, the first ILD layer 320 is formed to a thickness of about 10 kÅ. According to a preferred embodiment of the present invention, the first ILD layer 320 is formed according to the acts illustrated in FIG. 2B, beginning with act 221, forming a first USG layer. FIG. 4 illustrates a first USG layer 322 formed over the substrate 301. As will be understood by one of ordinary skill in the art, the first USG layer 322 is formed to significantly prevent migration of dopants such as phosphorus from PSG or phosphorus and boron from BPSG of the ILD layer 320 to the polysilicon layer 310 or silicon layer 301. Following the formation of the first USG layer 322, a PSG layer 323 is formed in act 222 of FIG. 2B, and the USG layer and PSG layer are subsequently densified in act 223. The densification performed in act 223 may be accomplished by thermal flow processes, as will be understood by one of ordinary skill in the art. Densification is performed to generally reduce the viscosity of ILD layer 320, thereby generally stabilizing the ILD layer.

Following the densification illustrated in act 223, a planarization of the PSG layer 323 of FIG. 4 is performed. The planarization of the PSG layer 323 can be performed, for example, by a Chemical Mechanical Polishing (CMP) process. As will be understood by one of ordinary skill in the art, CMP is accomplished by using a combination of chemical etching and mechanical abrasion, wherein a slurry is typically applied to the surface of a rotating platen or polishing head (not shown) to significantly planarize the PSG layer 323.

Figure 2B:
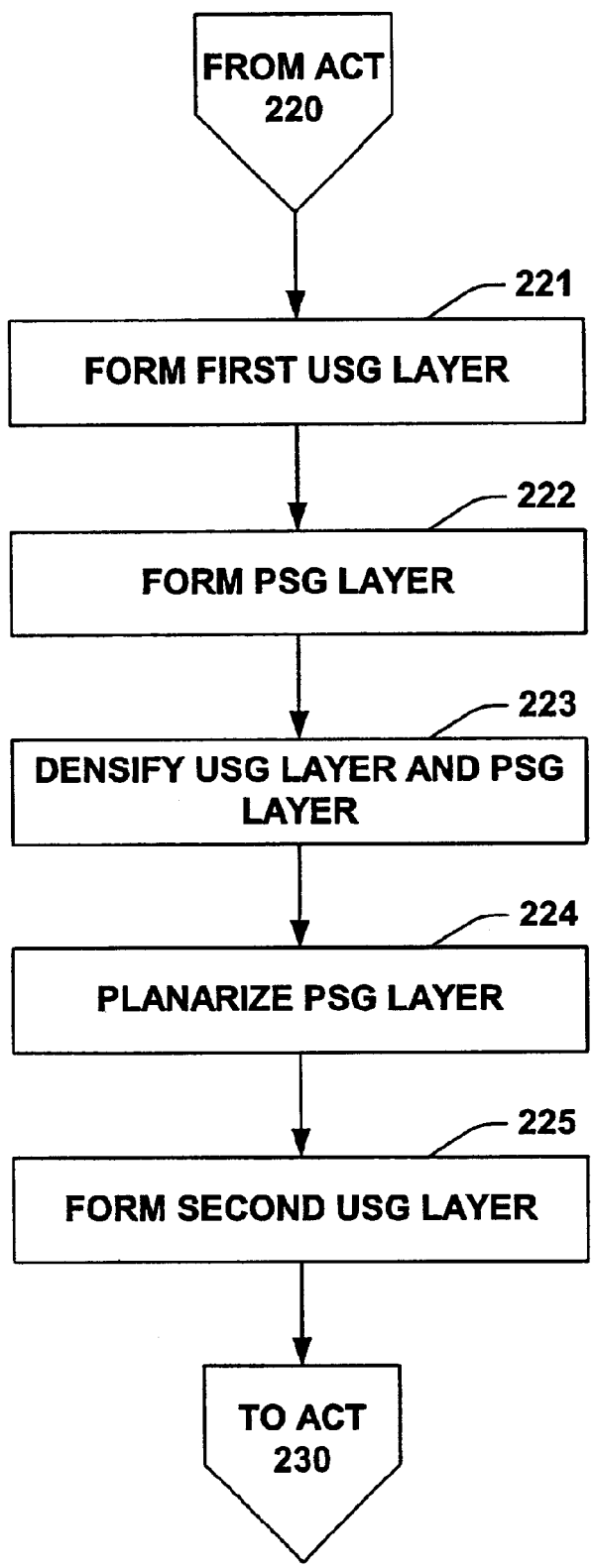
FIG. 2B illustrates a method for forming an analog capacitor according to one aspect of the present invention.
Figure 5:
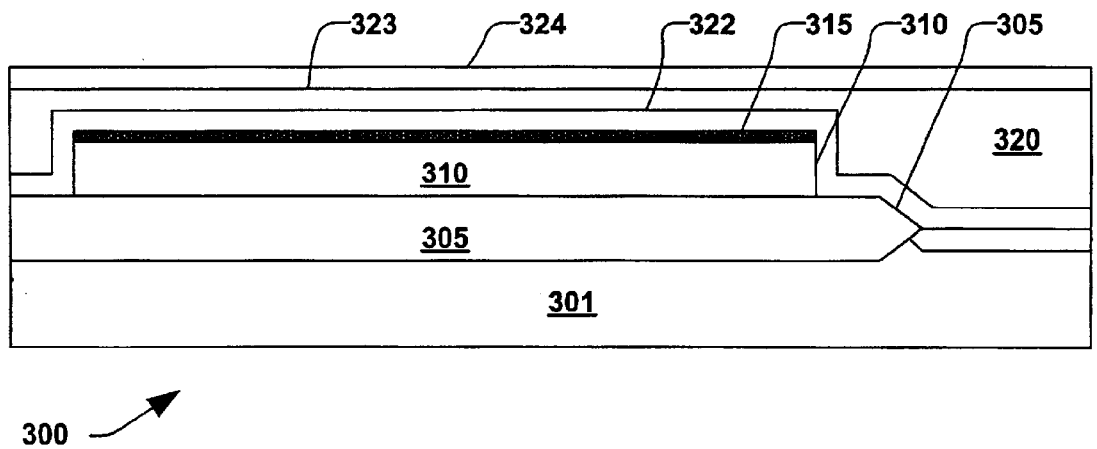
FIG. 5 illustrates a partial cross-sectional view of a step of forming first interlayer dielectric (ILD) layer for an analog capacitor according to one aspect of the present invention.
Figure 6:
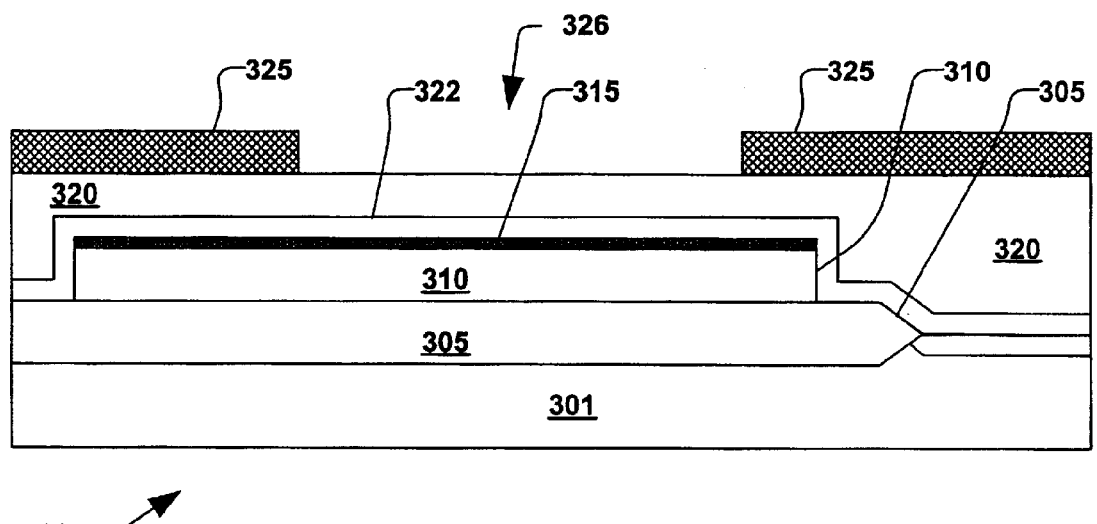
FIG. 6 illustrates a partial cross-sectional view of a step of forming a capacitor masking pattern for an analog capacitor according to the present invention.

After the planarization of the PSG layer 323 in act 224 of FIG. 2B, a second USG layer is formed over the substrate in act 225. FIG. 5 illustrates the second USG layer 324 formed over the PSG layer 323, thus completing the formation of the multi-layered first ILD layer 320. The second USG layer 324 may, for example, comprise tetraethylorthosilicate (TEOS) to block phosphorus diffusion between the PSG layer 323 and a subsequently formed metal layer (not shown). For purposes of clarity, the PSG layer 323 and the second USG layer 324 will be illustrated hereafter as the ILD layer 320 as illustrated in FIG. 6, however, the ILD layer 320 will be understood to comprise any interlayer dielectric layer.

Referring again to FIG. 2A, following the formation of the ILD layer 320 in act 220, a capacitor masking pattern is formed in act 230. FIG. 6 illustrates an exemplary capacitor masking pattern 325, wherein the capacitor masking pattern is formed by a conventional lithographic process, as will be understood by one of ordinary skill in the art. The capacitor masking pattern 325 generally exposes a capacitor region 326 of the first ILD layer 320 residing over the bottom plate 314, while covering the remainder of the semiconductor substrate 301 with photoresist. Subsequently, the first ILD layer 320 is etched in the capacitor region 326 in act 235 of FIG. 2A.

Figure 7:
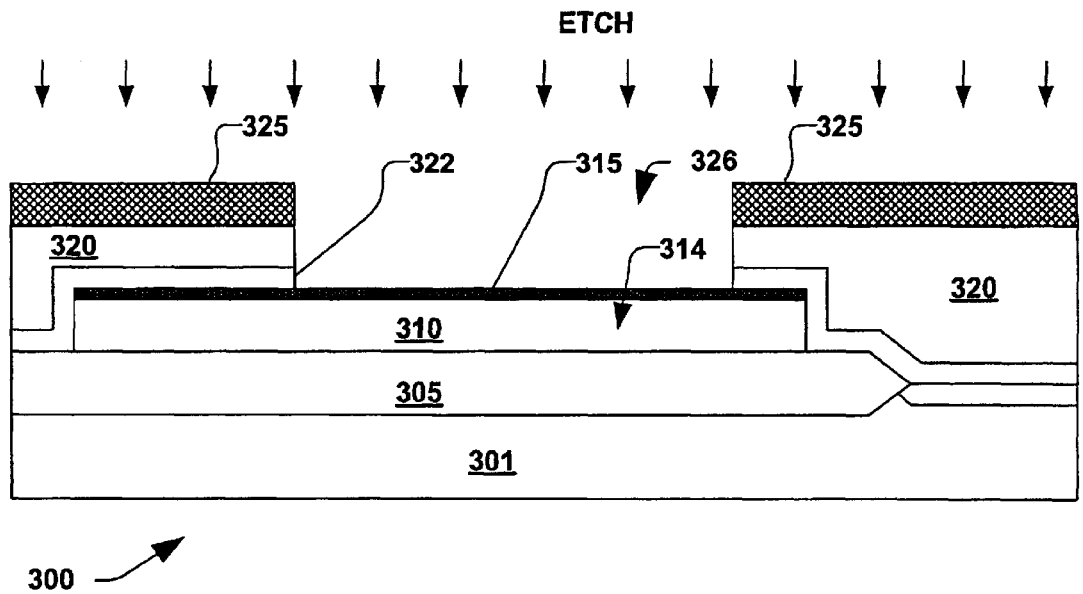
FIG. 7 illustrates a partial cross-sectional view of a step of etching the first ILD layer for an analog capacitor according to the present invention.

FIG. 7 illustrates the results of etching the first ILD layer 320 using the capacitor masking pattern 325 as a mask, and using the silicide layer 315 as an etch stop in the capacitor region 326. The etch process performed in act 235 of FIG. 2A, for example, comprises an anisotropic dry etching process which can be performed to expose the silicide layer 315 over the bottom plate 314 in the capacitor region 326. Following the etching of the first ILD layer 320, the mask 325 is removed by conventional processes, such as ashing.

Figure 8:
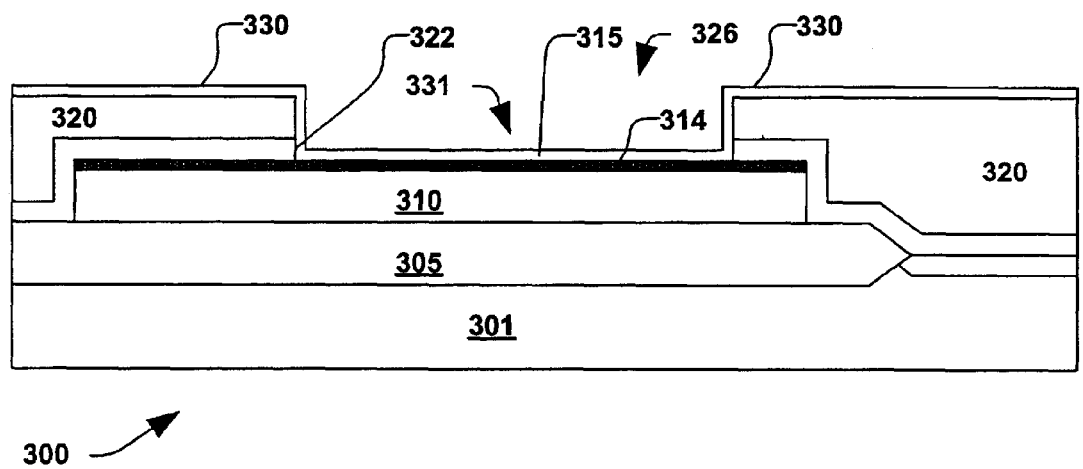
FIG. 8 illustrates a partial cross-sectional view of a step of forming a thin dielectric layer for an analog capacitor according to the present invention.

In act 240 of FIG. 2A, a thin dielectric is formed over the semiconductor substrate. FIG. 8 illustrates the thin dielectric 330 (e.g., a thin oxide) overlying the first ILD layer 320 and the silicide layer 315 which has been exposed in the capacitor region 326. Forming the thin dielectric 330 defines a capacitor dielectric 331 in the capacitor region 326, and also protects a subsequently deposited metal layer (not shown) from diffusion of gases from the first ILD layer 320, as will be described hereafter. The thin dielectric 330 is formed, for example, by a Low Pressure Chemical Vapor Deposition (LPCVD) process to a thickness of between 200 Å to 1000 Å, depending on capacitance and voltage coefficient requirements. Smaller thicknesses of the thin dielectric 330 result in a relatively high capacitance per unit area, as is typically preferred in analog applications. However, smaller thicknesses (less than 200 Å) of the thin dielectric 330 may also result in relatively higher voltage coefficients, which are not typically desirable in analog applications.

Forming the thin dielectric 330 by LPCVD processing is advantageous because LPCVD processing forms a generally uniform thickness of the thin dielectric 330, which is especially important in the capacitor region 326 to maintain a low hysteresis of the capacitor (not shown). Other methods of forming the thin dielectric 330 such as PECVD, APCVD, or other processing, however, are contemplated as falling within the scope of the present invention. According to one exemplary aspect of the present invention, a titanium nitride (TiN) layer (not shown) is formed over the thin dielectric 330 to further protect the thin dielectric 330 from subsequent planarization, as will be described hereafter.

Figure 9:
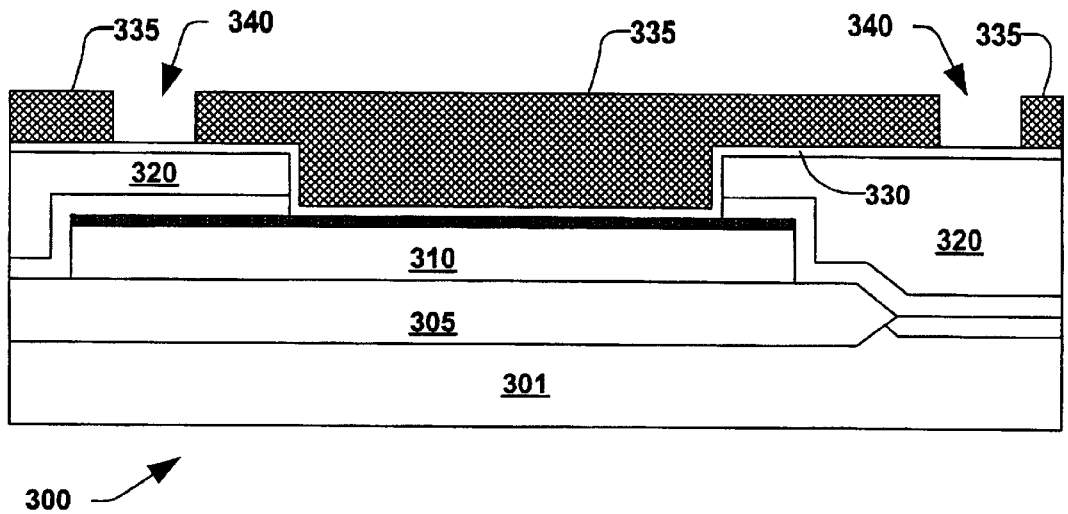
FIG. 9 illustrates a partial cross-sectional view of a step of forming a contact masking pattern for an analog capacitor according to the present invention.
Figure 10:
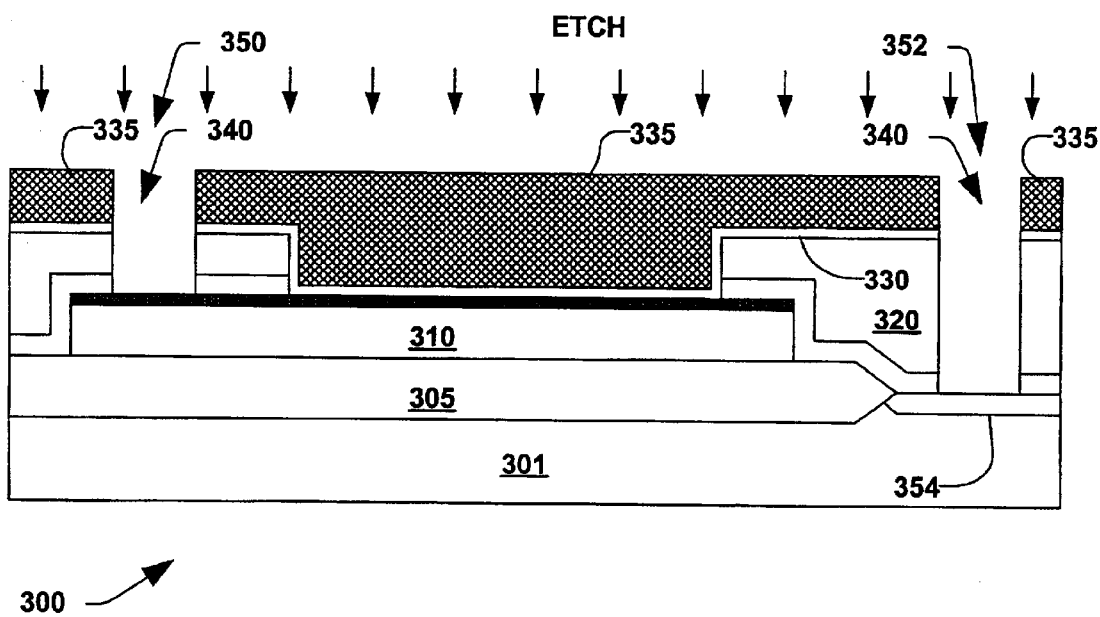
FIG. 10 illustrates a partial cross-sectional view of a step of etching the thin dielectric and first ILD layer for an analog capacitor according to the present invention.

Following the formation of the thin dielectric 330 in act 240 of FIG. 2A, a contact masking pattern is formed in act 245. FIG. 9 illustrates a contact masking pattern 335 which has been formed by conventional photolithographic processing. The contact masking pattern 335 comprises one or more contact holes 340 which expose the thin dielectric 330, while the remainder of the semiconductor substrate 301 is covered by the contact masking pattern. Subsequently, in act 250 of FIG. 2A, an etch process is performed using the contact masking pattern 335 of FIG. 9 as a mask, and the silicide 315 as an etch stop. FIG. 10 illustrates the results of performing act 250, wherein the thin dielectric 330 and the first ILD layer 320 have been etched through the contact holes 340 in the contact masking pattern 335. According to one exemplary aspect of the present invention, a cleaning process is performed after the etch process of act 250 of FIG. 2A in order to remove any remaining etch byproducts.

According to another exemplary aspect of the present invention, the etch process performed in act 250 etches the thin dielectric 330 and the first ILD layer 320 underlying the contact holes 340 in the contact masking pattern 335 to form a bottom plate contact hole 350 and a moat contact hole 352, as illustrated in FIG. 10. Accordingly, the etch process of act 250 utilizes the silicide layer 315 as an etch stop in forming the bottom plate contract hole 350, and utilizes a moat 354 as an etch stop in forming the moat contact hole 352. The moat 354, for example, is a heavily doped region of the semiconductor substrate 301 which permits the application of specific electrical potentials such as ground potential or $V_{SS}$ to devices formed on the substrate. It should be noted that the etch process performed in act 250 of FIG. 2A does not suffer the deleterious effects of etching a TiN layer as described in the aforementioned prior art.

In conventional processing, a dry TiN etch is used in order to yield straight TiN layer profiles. However, a significant drawback to a dry TiN etch is a low etch selectivity of TiN-to-poly or TiN-to-silicon. If a dry over-etch is optimized for removing TiN "stringers" (e.g., TiN which remains along the edges of the poly 310 or field oxide 305), the etch starts pitting into the semiconductor surface 301, thereby causing diode leakage problems. One solution is to convert all or part of the dry etch into a wet etch, as the wet etch removes TiN stringers more readily without damaging semiconductor surface 301. However, a wet etch may deleteriously undercut the TiN layer and dielectric layers (e.g., capacitor edges). This, in turn, degrades capacitor matching performance, which is a key requirement for capacitors used in analog circuit applications.

Figure 11:
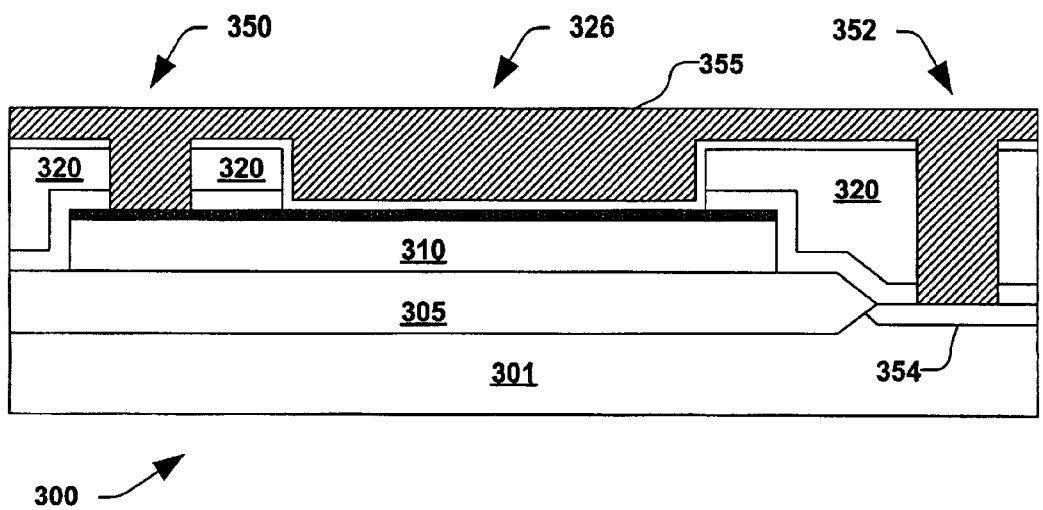
FIG. 11 illustrates a partial cross-sectional view of a step of forming a metal layer for an analog capacitor according to the present invention.
Figure 12:
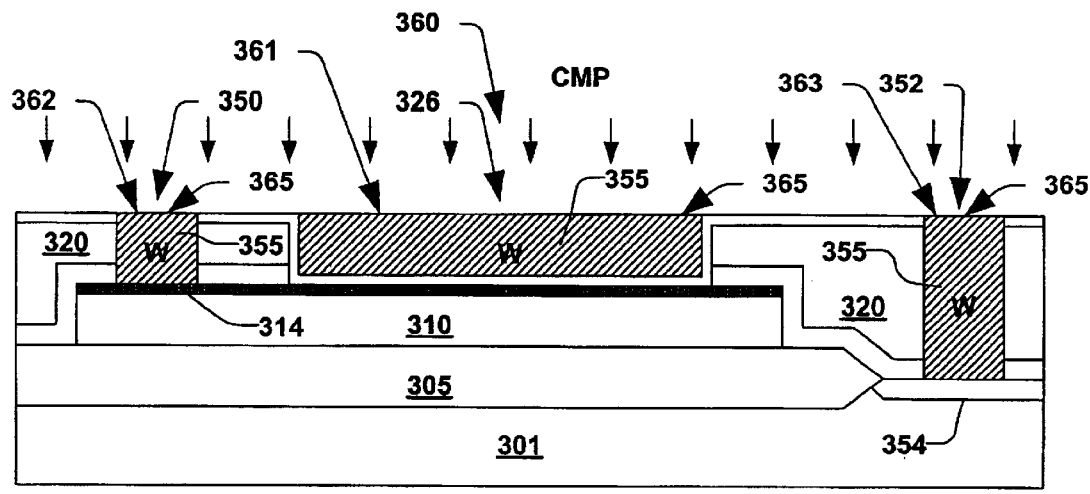
FIG. 12 illustrates a partial cross-sectional view of a step of planarizing the first metal layer for an analog capacitor according to the present invention.

Following the etching process performed in act 250 of FIG. 2A, a metal layer is deposited over the semiconductor substrate in act 255. FIG. 11 illustrates a metal layer 355 which has been formed over the semiconductor substrate 301. The metal layer 355 comprises, for example, tungsten, wherein the metal layer generally fills the bottom plate contact hole 350, the moat contact hole 352, and the capacitor region 326. Subsequently, the metal is planarized in act 260 of FIG. 2A to remove a portion of the metal layer 355. As illustrated in FIG. 12, the planarization performed in act 260 is performed to electrically isolate the capacitor 360, and to furthermore define a top plate 361 of the capacitor, a bottom plate connector 362, and a moat connector 363. Furthermore, electrical connection regions 365 to the top plate 361, bottom plate connector 362, and moat connector 363 are defined by the planarization performed in act 260. According to one aspect of the invention, the metal layer 355 advantageously provides low voltage coefficients in the capacitor 360 due to being a metal such as tungsten.

Figure 13:
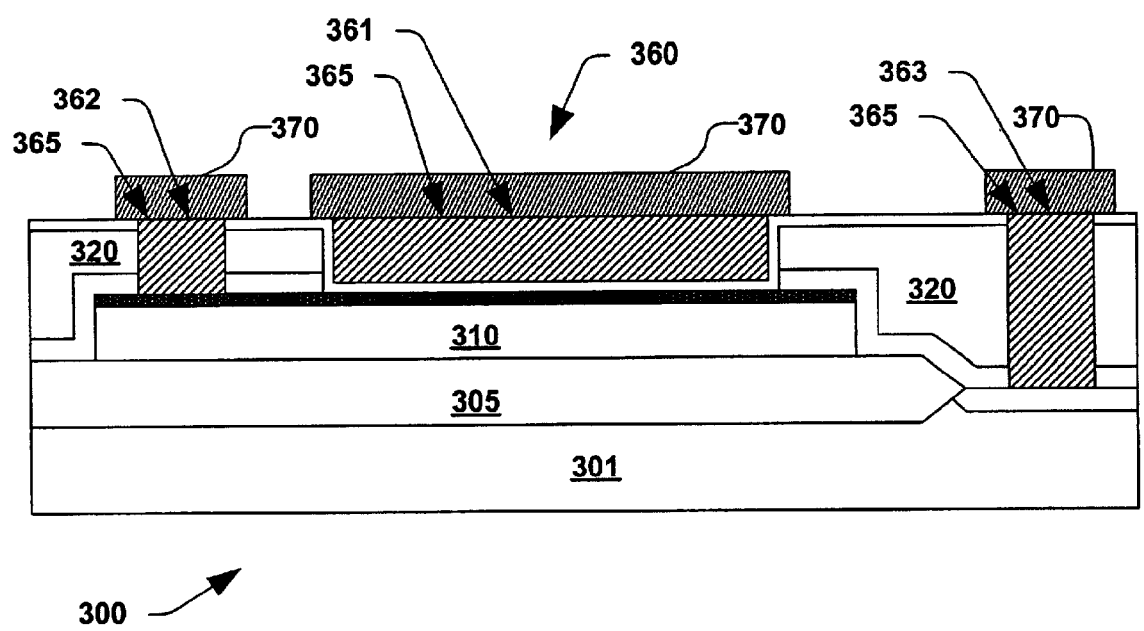
FIG. 13 illustrates a partial cross-sectional view of a step of forming a conductive connecting layer for an analog capacitor according to the present invention.

The planarization furthermore electrically isolates the capacitor 360 from other devices (not shown) on the semiconductor substrate 301. According to another exemplary aspect of the present invention, a barrier metal (not shown) such as titanium and/or titanium nitride is formed prior to depositing the metal layer in act 255 of FIG. 2A. Furthermore, the barrier metal (not shown) is also planarized along with the metal layer deposited in act 255. According to yet another exemplary aspect of the invention, a conductive connecting layer 370, as illustrated in FIG. 13, can be formed and patterned over the electrical connection regions 365 in order to connect the capacitor 360 to other devices (not shown) on the semiconductor substrate 301.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A method for forming a high precision analog capacitor on a semiconductor substrate, the method comprising:

forming a field oxide layer over a portion of the substrate;

forming a polysilicon layer over the field oxide layer;

forming a silicide over the polysilicon layer, thereby defining a bottom plate of the capacitor;

forming a first interlayer dielectric over the substrate;

forming a capacitor masking pattern over the substrate;

etching the first interlayer dielectric using the capacitor masking pattern as a mask and the silicide as an etch stop, thereby defining a capacitor region;

forming a thin dielectric over the substrate;

forming a contact masking pattern over the substrate;

etching the thin dielectric and the first interlayer dielectric using the contact masking pattern as a mask and the silicide as an etch stop to form a bottom plate contact hole;

depositing a metal over the substrate, thereby filling the capacitor region and the bottom plate contact hole; and planarizing the metal, wherein a top plate of the capacitor and an electrical connection to the bottom plate of the capacitor are defined, and wherein the top plate of the capacitor and the electrical connection to the bottom plate of the capacitor are laterally isolated by the first interlayer dielectric.

2. The method of claim 1, wherein forming a first interlayer dielectric over the substrate comprises:
   depositing a first undoped silicate glass layer over the substrate;
   depositing a phosphosilicate glass layer over the substrate;
   densifying the first undoped silicate glass layer and the phosphosilicate glass layer; and
   planarizing the phosphosilicate glass layer.

3. The method of claim 2, further comprising depositing a second undoped silicate glass layer over the planarized phosphosilicate glass layer.

4. The method of claim 1, further comprising planarizing the first interlayer dielectric.

5. The method of claim 4, wherein the act of planarizing the first interlayer dielectric comprises chemical mechanical polishing.

6. The method of claim 1, wherein the act of forming a first interlayer dielectric over the substrate comprises forming a tetraethyl-orthosilicate (TEOS) layer to a thickness of about 10 KÅ.

7. The method of claim 1, wherein the thin dielectric comprises a thin oxide.

8. The method of claim 1, wherein forming the thin dielectric over the substrate comprises a low pressure chemical vapor deposition (LPCVD) process to form the thin dielectric to a thickness of between 200 Å and 1000Å.

9. The method of claim 1, further comprising cleaning the substrate after etching the thin dielectric and the first interlayer dielectric layer.

10. The method of claim 1, further comprising forming a barrier metal layer over the substrate prior to depositing the metal layer.

11. The method of claim 10, wherein the barrier metal layer comprises titanium nitride or titanium tungsten.

12. The method of claim 1, further comprising:
    depositing a first wiring layer over the substrate;
    forming a first wiring layer masking pattern; and
    etching the first wiring layer using the first wiring layer masking pattern as a mask and the thin dielectric layer as an etch stop.

13. The method of claim 1, wherein the metal layer comprises tungsten.

14. The method of claim 1, wherein the act of planarizing the metal layer comprises chemical mechanical polishing.

15. The method of claim 1, further comprising forming a titanium nitride layer or a titanium tungsten layer over the thin dielectric layer, and wherein etching the thin dielectric and the first interlayer dielectric using the contact masking pattern as a mask further comprises etching the respective titanium nitride layer or titanium tungsten layer.

16. The method of claim 1, wherein etching the thin dielectric and the first interlayer dielectric further comprises forming a moat contact hole by using the contact masking pattern as a mask and a moat as an etch stop.

17. The method of claim 16, wherein depositing a metal over the substrate further comprises filling the moat contact hole.

18. The method of claim 17, wherein planarizing the metal further comprises defining an electrical connection to the moat, and wherein the top plate of the capacitor and the electrical connection to the bottom plate of the capacitor and the electrical connection to the moat are laterally isolated by the first interlayer dielectric.

19. A method for forming a high precision analog capacitor on a semiconductor substrate, the method comprising:
    forming a field oxide layer over a portion of the substrate;
    forming a polysilicon layer over the field oxide layer;
    forming a silicide over the polysilicon layer, thereby defining a bottom plate of the capacitor;
    depositing undoped silicate glass over the substrate;
    depositing phosphosilicate glass over the substrate;
    densifying the undoped silicate glass and the phosphosilicate glass;
    planarizing the phosphosilicate glass;
    depositing undoped silicate glass over the planarized phosphosilicate glass;
    forming a capacitor masking pattern over the substrate;
    etching the undoped silicate glass and phosphosilicate glass using the capacitor masking pattern as a mask and the suicide as an etch stop, thereby defining a capacitor region;
    forming a thin dielectric over the substrate;
    forming a contact masking pattern over the substrate;
    etching the thin dielectric, undoped silicate glass and phosphosilicate glass using the contact masking pattern as a mask and the silicide as an etch stop to form a bottom plate contact hole;
    depositing a metal over the substrate, thereby filling the capacitor region and the bottom plate contact hole; and
    planarizing the metal, wherein a top plate of the capacitor and an electrical connection to the bottom plate of the capacitor are defined, and wherein the top plate of the capacitor and the electrical connection to the bottom plate of the capacitor are laterally isolated by the undoped silicate glass and phosphosilicate glass.

20. The method of claim 19, wherein the act of depositing undoped silicate glass over the substrate comprises depositing a tetraethyl-orthosilicate (TEOS) layer to a thickness of about 10 KÅ.

21. The method of claim 19, wherein the thin dielectric comprises a thin oxide.

22. The method of claim 19, wherein forming the thin dielectric over the substrate comprises low pressure chemical vapor deposition (LPCVD) processing forming the thin dielectric to a thickness of between 200 Å and 1000Å.

23. The method of claim 19, further comprising cleaning the substrate after etching the thin dielectric, undoped silicate glass and phosphosilicate glass.

24. The method of claim 19, further comprising forming a barrier metal layer over the substrate prior to depositing the metal layer.

25. The method of claim 24, wherein the barrier metal layer comprises titanium nitride or titanium tungsten.

26. The method of claim 19, further comprising:
    depositing a first wiring layer over the substrate;
    forming a first wiring layer masking pattern; and
    etching the first wiring layer using the first wiring layer masking pattern as a mask and the thin dielectric layer as an etch stop.

27. The method of claim 19, wherein the act of planarizing the phosphosilicate glass comprises chemical mechanical polishing.

28. The method of claim 19, wherein the metal layer comprises tungsten.

29. The method of claim 19, wherein the act of planarizing the metal layer comprises chemical mechanical polishing.

30. The method of claim 19, further comprising forming a titanium nitride layer or a titanium tungsten layer over the thin dielectric layer, and wherein etching the thin dielectric, undoped silicate glass and phosphosilicate glass using the contact masking pattern as a mask further comprises etching the respective titanium nitride layer or titanium tungsten layer.

31. The method of claim 19, wherein etching the thin dielectric and the first interlayer dielectric further comprises forming a moat contact hole by using the contact masking pattern as a mask and a moat as an etch stop.

32. The method of claim 31, wherein depositing a metal over the substrate further comprises filling the moat contact hole.

33. The method of claim 32, wherein planarizing the metal further comprises defining an electrical connection to the moat, and wherein the top plate of the capacitor and the electrical connection to the bottom plate of the capacitor and the electrical connection to the moat are laterally isolated by the first interlayer dielectric.

* * * * *